United States Patent [19]

Cronin et al.

[11] Patent Number: 5,194,928
[45] Date of Patent: Mar. 16, 1993

[54] PASSIVATION OF METAL IN METAL/POLYIMIDE STRUCTURE

[75] Inventors: John E. Cronin, Milton; Paul A. Farrar, Sr., South Burlington; Harold G. Linde; Rosemary A. Previti-Kelly, both of Richmond, all of Vt.

[73] Assignee: International Business Machines Corporation, Armonk, N.Y.

[21] Appl. No.: 842,307

[22] Filed: Feb. 26, 1992

Related U.S. Application Data

[62] Division of Ser. No. 641,036, Jan. 14, 1991, Pat. No. 5,114,754.

[51] Int. Cl.$^5$ ............................................. H01L 29/34
[52] U.S. Cl. ................................. 257/629; 148/33.3; 427/387; 437/235; 437/243; 257/40
[58] Field of Search ....................... 427/387; 148/33.3; 257/8, 52; 437/235, 243

[56] References Cited

U.S. PATENT DOCUMENTS

| | | | |
|---|---|---|---|
| 3,179,614 | 4/1965 | Edwards | 260/30.2 |
| 3,264,250 | 8/1966 | Gall | 260/32.6 |
| 4,152,195 | 5/1979 | Bahrle et al. | 156/656 |
| 4,423,547 | 1/1984 | Farrar et al. | 29/571 |
| 4,529,618 | 7/1985 | Ponjee et al. | 427/82 |
| 4,590,258 | 5/1986 | Linde et al. | 528/189 |
| 4,612,210 | 9/1986 | Hofer et al. | 427/82 |
| 4,626,556 | 12/1986 | Nozue et al. | 522/99 |
| 4,723,978 | 2/1988 | Clodgo et al. | 65/31 |
| 4,753,827 | 6/1988 | Yoldas et al. | 427/387 |
| 4,778,727 | 10/1988 | Tesoro et al. | 428/448 |
| 4,797,307 | 1/1989 | Kunimoto et al. | 427/386 |
| 4,981,530 | 1/1991 | Clodgo et al. | 437/235 X |
| 5,043,789 | 8/1991 | Linde et al. | 427/387 X |
| 5,114,757 | 5/1992 | Linde et al. | 427/387 |

FOREIGN PATENT DOCUMENTS 0266208  6/1987  European Pat. Off.

OTHER PUBLICATIONS

Kim, et al., "Adhesion and Interface Studies Between Copper and Polyimide", J. Adhesion Sci. Tech., vol. 1, No. 4 (1987), pp. 331-339.

"Improved Metallurgy for Wiring Very Large Scale Integrated Circuits", International Technology Disclosures, vol. 4, No. 9 (Sep. 1986).

*Primary Examiner*—Michael Lusigan
*Attorney, Agent, or Firm*—William D. Sabo

[57] ABSTRACT

Disclosed is a process for passivating a metal surface in a metal/polyimide structure, such as a polyimide layer on a semiconductor substrate containing a pattern of metallization. The process involves the formation of an intermediate layer of a silsesquioxane polymer between the polyimide layer and the substrate. The silsesquioxane layer passivates the metal, to inhibit interaction between the metal surface and the polyimide precursor material used in forming the polyimide, to provide a moisture-resistant and oxidation-resistant interface.

7 Claims, No Drawings

PASSIVATION OF METAL IN METAL/POLYIMIDE STRUCTURE

This application is a division of Ser. No. 641,036, filed Jan. 14, 1991, now U.S. Pat. No. 5,114,754.

BACKGROUND OF THE INVENTION

1. Field of the Invention

The present invention relates to a process for forming a polyimide layer on an underlying metal surface, such as a substrate containing a pattern of metallization, e.g. copper. More particularly, the process involves formation of an intermediate passivation layer, which serves to passivate the metal from interaction with the polyimide precursor material.

2. Description of the Prior Art

Polyimides are being used increasingly in the microelectronics industry. For example, polyimides formed by the thermal curing of polyimide precursors, such as polyamic acids, can be used as passivation dielectrics on semiconductor devices. See, for example, U.S. Pat. No. 4,590,258, issued to Linde, et al., on May 20, 1986.

Two types of interfaces between polyimides and metals have been studied, viz. metal-on-polymer and polymer-on-metal. Most attention has been given to the first type, formed by vapor deposition of metal films on cured polyimide layers. In this type, problems arise due to poor adhesion, leading to oxidation and moisture penetration at the interface. Techniques have been developed in the art in an effort to improve the adherence. In U.S. Pat. No. 4,152,195, issued to Bahrle, et al., on May 1, 1979, the process involves only partially curing the polyimide precursor material before vapor depositing the desired metal, followed by completing the cure of the polyimide.

Also illustrative of the art is U.S. Pat. No. 4,797,307, issued to Kunimoto, et al., on Jan. 10, 1989, which provides a process for preparing a polyimide film having improved adhesiveness to a metal foil, such as copper. According to the process, a treating solution containing an aminosilane is coated on a surface of a polyamic acid film, which is then heated to effect imidization. The cured polyimide film is then pressed together with an adhesive-coated copper foil to produce a laminate sheet.

The second type of interface, i.e. polymer-on-metal, is formed by coating a polyimide precursor material on to a metal film, and then carrying out a curing step. However, the metal, e.g. copper, has been shown to interact with commonly used polyimide precursor materials (polyamic acids). See Kim, et al., "Adhesion And Interface Studies Between Copper And Polyimide", *J. Adhesion Sci. Tech.*, Vol. 1, No. 4 (1987), pp. 331–339. Copper and other reactive metals form salts that retard thermal imidization and decompose the polyimide polymer during the high temperature curing step.

In the field of multilevel interconnection metallurgy, it is known to use a layer of silicon nitride or polyimide as an interlevel dielectric between metal layers or a dual component dielectric that includes a layer of each. See U.S. Pat. No. 4,423,547, issued to Farrar, et al. on Jan. 3, 1984, in which a layer of silicon nitride is deposited on metal, followed by deposition of a thicker layer of polyimide. In such systems, the silicon nitride will serve to passivate the underlying metal; however, it does present a problem, in that the nitride is prone to cracking due to a large stress-mismatch with respect to the polyimide. Further, it tends to lock in moisture, leading to oxidation of the metal, and degrades overall capacitance of the system.

Thus, there is a need for an improved process to passivate the metal, thus reducing or eliminating interaction with the polyimide precursor material, but without significantly degrading the electrical characteristics of the metal.

It is also known to form silsesquioxane polymers for use as insulating layers in semiconductor devices. For example, in Eur. Pat. Appln., published under U.S. Pat. No. 0,226,208 on Jun. 24, 1987, an insulating layer is formed by applying to a substrate a prepolymer, and then heating it at a temperature above 400° C. in the presence of oxygen. The prepolymer is prepared by hydrolyzing and polycondensating a mixture of a tetraalkoxysilane, a trialkoxysilane and a dialkoxysilane in a select mole ratio.

In U.S. Pat. No. 4,626,556, issued to Nozue, et al., on Dec. 2, 1986, water is reacted with a trihalogenosilane in the production of a non-amino-containing silsesquioxane polymer, which is used in a mixture with a compound which generates crosslinking-reaction-active species upon irradiation, in the formation of an insulating layer. In U.S. Pat. No. 4,723,978, issued to Clodgo, et al., on Feb. 9, 1988, an organoglass insulating layer is produced by first forming a modified ladder-type silsesquioxane polymer from a silanol solution, and then treating it in an oxygen plasma.

However, none of these approaches involves the formation of a silsesquioxane polymer as a passivation layer in a metal/polyimide structure.

SUMMARY OF THE INVENTION

It is against this background that the present invention provides an improved process for forming a polyimide layer on an underlying metal surface. In accordance with the invention, an organic solution is first applied to the underlying metal surface, the solution being prepared by reacting an aminoalkoxysilane monomer and water in a solvent. After that, a heating step is performed to form a layer of cured silsesquioxane polymer, so as to passivate the metal and inhibit interaction between the metal and the polyimide precursor material to be applied. A solution comprising a polyimide precursor material is then applied, and another heating step is carried out to imidize the polyimide precursor material. In the practice of the invention, a cured structure is obtained in which there is formed a highly effective passivation layer between the polyimide and the underlying metal, which is moisture-resistant and resistant to oxidation of the metal, while also providing, in many cases, a high degree of thermal stability.

DETAILED DESCRIPTION

In accordance with the process, an organic solution is applied to an underlying metal surface, such as a metal film or a processed semiconductor substrate, containing a pattern of metallization. In such cases, the substrate typically comprises an insulator layer which includes a pattern of metal. For example, the insulator layer commonly comprises silicon dioxide, silicon nitride, reflowed phosphosilicate glass or a polyimide, such as polyimides formed from pyromellitic dianhydride and oxydianiline, or benzophenone tetracarboxylic acid dianhydride and oxydianiline and/or m-phenylene diamine or other aromatic polyimides or polyamide-imides known to those skilled in the art.

Typical metals include transition metals or alloys of transition metals, refractory metals or silicides of refractory metals, etc., for example, copper, aluminum, silver, chromium, lead, tin, gold, the Groups IVA, VA and VIA metals, such as titanium, zirconium, hafnium, vanadium, tantalum and tungsten, and so forth. In a preferred embodiment, copper or an alloy of copper is employed. Under some circumstances, it may be desirable to utilize a two or more layer composite, for example, to provide better contact to other materials or to enhance electromigration resistance. See, for example, "Improved Metallurgy For Wiring Very Large Scale Integrated Circuits", International Technology Disclosures, Vol. 4, No. 9 (Sep. 1986), the entire disclosure of which is incorporated herein by reference. Preferred two layer composites include a lower layer of titanium, zirconium or hafnium and an upper layer of copper, gold, silver or aluminum; while preferred three layer composites include lower and upper layers, which are independently titanium, zirconium, hafnium, chromium, vanadium or tantalum, and an intermediate layer of copper, gold, silver or aluminum. Thicknesses of the metal may vary widely; for purposes of illustration, however, in a preferred two layer composite, about 100–1,000 Å of titanium or zirconium and about 500–10,000 Å of copper are employed.

The organic solution is applied to the underlying surface in a conventional fashion, such as spin coating, at a spin speed of about 2,000–5,000 rpm, depending upon the desired thickness. The organic solution may be prepared by reacting an aminoalkoxysilane monomer and water in a solvent. Suitable aminoalkoxysilane monomers include aminotrialkoxysilanes represented by the formula:

(A)

wherein $R_1$ is a hydrogen atom; a saturated hydrocarbon residue or an amino-substituted, saturated hydrocarbon residue, preferably having 1 to 5 carbon atoms; or an alkyl-substituted phenyl group or derivatives thereof, the alkyl group preferably having 1 to 5 carbon atoms; wherein $R_2$ is a saturated hydrocarbon residue, preferably having 2 to 6 carbon atoms or an alkyl-substituted, preferably dialkyl-substituted, phenyl group or derivatives thereof, each alkyl group preferably having 1 to 5 carbon atoms; and wherein $R_3$ is a saturated hydrocarbon residue, preferably having 1 to 8 carbon atoms. Also, mixtures of such aminotrialkoxysilanes can be used.

Representative aminoalkoxysilane monomers include the following: γ-aminopropyltrimethoxysilane, γ-aminopropyltriethoxysilane, N-β-(aminoethyl)-γ-aminopropyltrimethoxysilane, N-β-(aminoethyl)-γ-aminopropyltriethoxysilane, N-β-aminoethyl-γ-aminopropyltris-(β-ethylhexoxy) silane, trimethoxysilylpropyldiethylenetriamine, (aminoethylaminomethyl) phenethyltrimethoxysilane and α-trimethoxysilyl-β-(p-m-aminomethyl)-phenylethane.

Preferred aminoalkoxysilane monomers include aminotrialkoxysilanes represented by the above formula (A), wherein $R_1$ is a hydrogen atom or a saturated hydrocarbon residue or an amino-substituted, saturated hydrocarbon residue, having 2 or 3 carbon atoms; wherein $R_2$ is a saturated hydrocarbon residue having 3 to 6 carbon atoms; and wherein $R_3$ is a saturated hydrocarbon residue having 1 to 4 carbon atoms.

A particularly preferred group of aminoalkoxysilane monomers includes the following aminotrialkoxysilanes: γ-aminopropyltrimethoxysilane, γ-aminopropyltriethoxysilane, N-β-(aminoethyl)-γ-aminopropyltrimethoxysilane and N-β-(aminoethyl)-γ-aminopropyltriethoxysilane.

In carrying out the reaction between the aminoalkoxysilane and water, a mole ratio of water/monomer in the range from about 1:1 to about 1.7:1 is employed. Preferably, a mole ratio of water/monomer in the range from about 1.2:1 to about 1.4:1 is employed.

The organic solution may also be prepared by reacting an aminoalkoxysilane monomer, an arylalkoxysilane or arylsilazane monomer and water in a solvent. Suitable aminoalkoxysilane monomers include the aminotrialkoxysilanes represented by the formula (A) set forth hereinabove.

The arylalkoxysilane or arylsilazane monomer employed in preparing the solution is preferably represented by the formula:

(B)

wherein $R_4$ is an unsubstituted or substituted aromatic residue, such as

(C)

wherein n=0–6, and more preferably 0–3, e.g. benzyl or higher functionalities, and $R_5$ is a hydrogen atom or a saturated hydrocarbon residue, preferably having 1 to 8 carbon atoms, more preferably 1 to 4 carbon atoms, e.g. xylyl or mesitylyl; and wherein Y is ($OR_6$) or $N(R_7)_2$, wherein $R_6$ is a saturated hydrocarbon residue having 1 to 5 carbon atoms and $R_7$ is a hydrogen atom or a saturated hydrocarbon residue having 1 to 5 carbon atoms. Also, mixtures of such arylalkoxysilanes and arylsilazanes can be used.

Representative arylalkoxysilane and arylsilazane monomers include the following: phenyltriethoxysilane, tris (dimethylamino) phenylsilane, bis (dimethylamino) diphenylsilane and bis (dimethylamino) methylphenylsilane.

Particularly preferred arylalkoxysilane and arylsilazane monomers include those in which $R_4$ is an unsubstituted or substituted phenyl group, and $R_6$ is a saturated hydrocarbon residue having 1 to 4 carbon atoms or $R_7$ is a hydrogen atom or a saturated hydrocarbon residue having 1 to 4 carbon atoms. Arylalkoxysilane monomers are most preferred, such as phenyltrialkoxysilane, e.g. phenyltriethoxysilane.

Any suitable solvent which can dissolve the aminoalkoxysilane and, if employed, the arylalkoxysilane or arylsilazane, and is miscible with water can be employed. Typical solvents include, for example, alcohols, such as methanol, ethanol, propanol, isopropanol, butanol, isobutanol, isoamyl alcohol, and the like; ethers, such as the cellosolves, e.g. methyl cellosolve, diglyme, dioxane, butyl carbitol, tetrahydrofuran, and the like; aromatic alcohols, such as phenol, and the like; polyhydric alcohols, such as ethylene glycol, tetramethylene glycol, and the like; ketones, such as methyl ethyl ketone, methyl isobutyl ketone, diethyl ketone, and the like; etc., as well as mixtures thereof, as will be apparent to those skilled in the art. Preferred solvents include methanol, ethanol and isopropanol.

Preferably, the reaction is carried out by employing a mole ratio of arylalkoxysilane or arylsilazane monomer to aminoalkoxysilane monomer in the range from about 1:3 to about 4:1, more preferably from about 2:3 to about 2.5:1, and a mole ratio of water/total monomer in the range from about 0.5:1 to about 2:1, more preferably from about 0.9:1 to about 1.7:1.

Other monomers may be added in preparing the organic solution. For example, to improve uniformity of the layer, higher functionality silane monomers, such as tetrafunctional silane monomers, which facilitate cross-linking, may be employed. In one preferred embodiment of the invention, the organic solution is prepared by reacting, in addition to the aminoalkoxysilane and arylalkoxysilane or arylsilazane monomers and water, a tetraalkoxysilane monomer, such as tetraethoxysilane. Preferably, the tetraalkoxysilane monomer is employed in a proportion up to about 50 percent, more preferably up to about 45 percent, and most preferably about 20 to about 45 percent, based on the moles of total monomer.

For additional details on the organic solution that is employed and its preparation, reference may be had to copending U.S. applications, Ser. No. 494,006, filed Mar. 15, 1990; Ser. No. 604,702, filed Oct. 26, 1990; and Ser. No. 276,597, filed Nov. 28, 1988, the entire contents of which are incorporated herein by reference.

After applying the solution, the coated substrate is heated to effect formation of a silsesquioxane polymer. The actual curing conditions, i.e. temperature, pressure and time, may vary over wide ranges and are generally dependent on the monomers employed, the water/monomer ratio, the desired thickness of the cured layer being produced, and other factors, which should be apparent to those skilled in the art. In general, however, temperatures in excess of about 200° C. for a period of about 15 to about 60 minutes at atmospheric pressure are typical.

In a preferred embodiment, the heat treatment is performed in a series of steps at atmospheric pressure. In this manner, the layer is exposed to a temperature of about 85°-160° C., or sequential temperatures within that range, to drive off solvent, and then to a high temperature, in excess of about 350° C. to form the final cured layer.

Generally, before applying the solution comprising the polyimide precursor material, a conventional adhesion promoter is usually employed to enhance adhesion to the cured silsesquioxane layer. Any suitable adhesion promoter, known to those skilled in the art, which will not degrade the silsesquioxane layer or interact with the polyimide precursor material can be used. Illustrative adhesion promoters are disclosed, for example, in U.S. Pat. No. 4,529,618, issued to Ponjee, et al., on Jul. 16, 1985, the entire contents of which are incorporated herein by reference. A preferred adhesion promoter is a solution of an aminoalkoxysilane in a conventional solvent, such as a solution of 3-aminopropyltriethoxysilane (commercially available from Union Carbide under the designation "A1100") or 1-trimethoxysilyl-2-(p-m-aminomethyl)-phenylethane (commercially available from Petrarch Systems, Inc.) in methanol, preferably 95% methanol/5% water. Such a solution is typically spin applied in a well known manner.

Next, a solution comprising a polyimide precursor material is applied to the cured layer by any suitable process. Suitable polyimide precursor materials include polyamic acid polymers which are based on the condensation of aromatic dianhydrides with diamines, more preferably aromatic diamines, and the corresponding polyamic ester polymers Suitable aromatic dianhydrides include pyromellitic dianhydride, 2,2-bis (3,4-dicarboxyphenyl) propane dianhydride, 2,3,6,7-naphthalene tetracarboxylic dianhydride, 2,2', 3,3'-diphenyl tetracarboxylic dianhydride, and benzophenone tetracarboxylic dianhydride. Suitable diamines include m-phenylene diamine, p-phenylene diamine, and 4,4'-diaminophenyl ether. Illustrative polyimide precursor materials useful for the purposes of this invention and their methods of preparation are disclosed in U.S. Pat. Nos. 3,179,614, 3,264,250 and 4,612,210, the entire disclosures of which are incorporated herein by reference. Particularly preferred polyamic acid polymers are available from E.I. duPont deNemours and Company, Wilmington, Delaware, under the trade designations "PI-2610", "PI-2545" and "PI-2525".

Typically, the polyimide precursor is dissolved in a suitable inert solvent, and then the solution is applied to the cured layer by spin coating, at a spin speed of about 1000-7000 rpm, depending upon the desired thickness. The solvents are not unduly limited, and a number of solvents or solvent mixtures can be used, for example, N-methyl pyrrolidinone (NMP), dimethyl acetamide (DMAc), dimethyl formamide (DMF), dimethyl sulfoxide (DMSO) or suitable mixtures of these solvents with various conventional hydrocarbon solvents.

After applying the solution, the substrate is heated to cure the polyimide precursor material. During this step, the polyimide precursor material is imidized to the corresponding polyimide. The actual curing conditions, i.e. temperature, pressure and time, may vary over wide ranges and are generally dependent on the polyimide precursor material employed and the desired thickness of the cured polyimide layer being produced, as well as other factors which should be apparent to those skilled in the art. In general, however, temperatures in excess of about 200° C., for a period of about 15-60 minutes at atmospheric pressure are typical.

In a preferred embodiment, the heat treatment is performed in a series of steps at atmospheric pressure. In this manner, the substrate is exposed to a temperature of about 85-160° C., or sequential temperatures within that range, to drive off solvent, and then to a high temperature, in excess of about 350° C. to form the final cured layer.

Apparently, during the first curing step to form the silsesquioxane layer, the polymer coordinates to the underlying metal through the amino groups, and this serves to passivate the metal surface. As such, this layer restricts interaction between the polyimide precursor material and metal and amine functionalities, so as to preclude attachment of the precursor functionality to the metal surface. Instead, imidization appears to proceed in a normal fashion above a siloxane interfacial region which is coordinated to the metal surface by amine-metal interactions. In any event, the silsesquioxane layer provides a highly effective passivation of the metal, and an improved interface with the metal which is moisture-resistant and oxidation-resistant.

The following examples are provided to illustrate the invention.

PREPARATION OF ORGANIC SOLUTIONS

EXAMPLE 1

A 490 ml aliquot of dry (<0.01% $H_2O$) methanol was transferred into a clean, dry Nalgene (polyethylene) bottle. A 10 ml aliquot of high purity[1] 3-aminopropyltriethoxysilane[2] was added to the methanol, and the solution was thoroughly mixed with the cap in place to control exposure to the atmosphere. A 1 ml aliquot of deionized, distilled $H_2O$ was then added with swirling of the silane/methanol solution, the bottle was capped, and the mixture was shaken vigorously for 10-20 seconds. The closed container was placed on a roller mill and mixed for about 16 hours at room temperature. The aged solution was filtered using a 0.2µ polypropylene filter under conditions ensuring minimal atmospheric exposure.

[1]. Monomer content <99.5% (Gas Chromatography), and total ionics' concentration <5 ppm.
[2]. Commercially available from Union Carbide under the designation "A1100".

EXAMPLE 2

A 490 ml aliquot of dry (<0.01% $H_2O$) methanol was transferred into a clean, dry Nalgene (polyethylene) bottle. A 5 ml aliquot of high purity[1] phenyltriethoxysilane[2] was added to the methanol, and the solution was thoroughly mixed with the cap in place to control exposure to the atmosphere. A 1 ml aliquot of deionized, $H_2O$ was then added with swirling of the silane/methanol solution, the bottle was capped, and the mixture was shaken vigorously for 10-20 seconds. A magnetic stir bar was placed in the solution and the bottle placed on a magnetic stirrer. At this time 5 ml of high purity[1] 3-aminopropyltriethoxysilane[3] was placed in a polypropylene addition funnel and connected to the bottle, and it was added over the course of 1 hour with good stirring. After addition the bottle was placed on a roller mill and mixed for about 16 ours. The aged solution was filtered using a 0.2µ polypropylene filter under conditions ensuring minimal atmospheric exposure.

[1]. Monomer content >99.5% (Gas Chromatography), and total ionics' concentration <5 ppm.
[2]. Commercially available from Petrach Systems, Inc. under the designation "P0320".
[3]. Commercially available from Union Carbide under the designation "A1100".

EXAMPLE 3

A 385 ml aliquot of dry (<0.01% $H_2O$) methanol was transferred into a clean, dry Nalgene (polyethylene) bottle. A 5 ml aliquot of high purity[1] phenyltriethoxysilane[2] was added to the methanol, and the solution was thoroughly mixed with the cap in place to control exposure to the atmosphere. A 1.25 ml aliquot of deionized, $H_2O$ was then slowly added with swirling of the silane/methanol solution, the bottle was capped, and the mixture was shaken vigorously for 10-20 seconds. A magnetic stir bar was placed in the solution and the bottle placed on a magnetic stirrer At this time 2.4 ml of high purity[1] 3-aminopropyltriethoxysilane[3] was placed in a polypropylene addition funnel with 100 ml of dry methanol and connected to the bottle, and the solution was added over the course of 1 hour with good stirring. Then, 4.6 ml of tetraethoxysilane (TEOS)[4] was added over the course of a few minutes with good stirring. After addition the bottle was placed on a roller mill and mixed for about 16 hours. The aged solution was filtered using a 0.2µ polypropylene filter under conditions ensuring minimal atmospheric exposure.

[1]. Monomer content >99.5% (Gas Chromatography), and total ionics' concentration <5 ppm.
[2]. Commercially available from Petrarch Systems, Inc. under the designation "P0320".
[3]. Commercially available from Union Carbide under the designation "A1100".
[4]. Commercially available from Petrarch Systems, Inc.

FORMATION OF CURED STRUCTURES

EXAMPLES 4-7

In Examples 4-6, the organic solutions prepared above in Examples 1-3, respectively, were then applied to silicon substrate wafers. The wafers were prepared by evaporating on to the surface a layer (5,000 Å) of titanium, followed by a layer (10,00Å) of copper, or a layer (10,000 Å) of aluminum. The coated wafers were then annealed in forming gas (10% hydrogen/90% nitrogen) at 400° C. for 30 minutes. The organic solutions were applied to the copper-or aluminum-coated wafers and let stand for 15 sec., then spun at a speed of 3,000 rpm for 30 seconds. The substrates were then heated at a temperature of 100° C. for 10 minutes to remove excess methanol and then baked at a temperature of 350° C. for 30 minutes (in nitrogen) to form a cured layer of silsesquioxane polymer.

To promote adhesion, a 0.1% solution of 3-aminopropyltriethoxysilane[1] in 95% methanol/5% water was then applied to the cured layer, let stand for 15 seconds, and then spun at 3,000 rpm for 30 seconds.

[1]. Commercially available from Union Carbide under the designation "A1100".

Following that, a solution of polyamic acid (11% solids, based on biphenylene tetracarboxylic dianhydride and p-phenylene diamine, commercially available from E.I. duPont deNemours and Company under the designation "PI-2610") in NMP was spin applied, at an initial spin speed of 500 rpm for 15 seconds, followed by a final spin speed of 4,000 rpm for 30 seconds. The wafers were then baked in air on an 8-position hotplate at temperatures of 95° C./105° C./105° C./115° C./115° C./ 135° C./135° C./135° C. for 20 minutes at ambient pressure. Thereafter the wafers were subjected to a final cure step at a temperature of 400° C. for 45 minutes in an oven, with a flow of dry nitrogen, filtered to eliminate particulates >0 2µ in diameter, maintained to minimize substrate oxidation by controlling the oxygen content to <10 ppm.

In Example 7, the procedure of Examples 4-6 was followed, except without the addition of the adhesion promoter to the cured layer. The organic solution prepared according to Example 1 was employed in making the cured structure.

The above-noted procedure produced cured structures, with a silsesquioxane film approximately 200 Å thick and a polyimide film approximately 10,000 Å thick.

The cured structures were then subjected to visual inspection of the metal surfaces for resistance to oxidation. The structures showed no evidence of oxidation upon inspection after formation, nor after exposing the wafers to moisture (85° C./80% relative humidity for 10 days).

We claim:

1. A cured composite structure, comprising a substrate comprising a metal surface, a polyimide layer, and a layer of silsesquioxane polymer intermediate said metal and said polyimide layer, said polymer containing reactive amino groups which coordinate to said metal, so as to passivate said metal and inhibit interaction between said metal and a polyimide precursor material to be applied in the formation of said polyimide layer, said structure being produced by:
- applying to said substrate an organic solution, prepared by reacting an aminoalkoxysilane monomer and water in a solvent;
- heating said substrate under such conditions as to form said layer of silsesquioxane polymer;
- applying to said layer a solution comprising a polyimide precursor material; and
- heating said substrate under such conditions as to imidize said polyimide precursor material.

2. A cured composite structure, comprising a substrate comprising a metal surface, a polyimide layer, and a layer of silsesquioxane polymer intermediate said metal and said polyimide layer, said polymer containing reactive amino groups which coordinate to said metal, so as to passivate said metal and inhibit interaction between said metal and a polyimide precursor material to be applied in the formation of said polyimide layer, said structure being produced by:
- applying to said substrate an organic solution, prepared by reacting an aminoalkoxysilane monomer, an arylalkoxysilane or arylsilazane monomer and water in a solvent;
- heating said substrate under such conditions as to form said layer of silsesquioxane polymer;
- applying to said layer a solution comprising a polyimide precursor material; and
- heating said substrate under such conditions as to imidize said polyimide precursor material.

3. A semiconductor structure, comprising a substrate containing a pattern of metallization, a polyimide layer, and a layer of silsesquioxane polymer intermediate said substrate and said polyimide layer, said polymer containing reactive amino groups which coordinate to said metal, so as to passivate said metal and inhibit interaction between said meal and a polyimide precursor material to be applied in the formation of said polyimide layer, said structure being produced by:
- applying to said substrate an organic solution, prepared by reacting;
- an aminoalkoxysilane monomer and water in a solvent, wherein said aminoalkoxysilane monomer is represented by the formula:

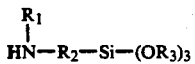

wherein:
- $R_1$ is a hydrogen atom or a saturated hydrocarbon residue or an amino-substituted, saturated hydrocarbon residue, having 2 or 3 carbon atoms;
- $R_2$ is a saturated hydrocarbon residue having 3 to 6 carbon atoms; and
- $R_3$ is a saturated hydrocarbon residue having 1 to 4 carbon atoms;
- or a mixture thereof; and
- said reaction is carried out by employing a mole ratio of water/monomer in the range from about 1.2:1 to about 1.4:1; or by reacting:
- an aminoalkoxysilane monomer, an arylalkoxysilane or arylsilazane monomer and water in a solvent, wherein said aminoalkoxysilane monomer is represented by the formula above;
- said arylalkoxysilane or arylsilazane monomer is represented by the formula, $R_4$-Si-$(Y)_3$, wherein $R_4$ is an unsubstituted or substituted phenyl group and Y is $OR_6$ or $(R_7)_2$, wherein $R_6$ is a saturated hydrocarbon residue having 1 to 4 carbon atoms, and $R_7$ is a hydrogen atom or a saturated hydrocarbon residue having 1 to 4 carbon atoms; and
- said reaction is carried out by employing a mole ratio of arylalkoxysilane or arylsilazane monomer to aminoalkoxysilane monomer in the range from about 2:3 to about 2.5:1, and a mole ratio of water/total monomer in the range from about 0.9:1 to about 1.7:1;
- heating said substrate at a temperature in excess of about 2090° C. for a period from about 15 to about 60 minutes to form said layer of silsesquioxane polymer;
- applying to said layer a solution comprising a polyimide precursor material; and
- heating said substrate at a temperature in excess of about 200° C. for a period from about 15 to about 60 minutes to imidize said polyimide precursor material.

4. A semiconductor structure, comprising a substrate containing a pattern of metallization, a polyimide layer, and a layer of silsesquioxane polymer intermediate said substrate and said polyimide layer, said polymer containing reactive amino groups which coordinate to said metal, so as to passivate said metal and inhibit interaction between said metal and a polyimide precursor material to be applied in the formation of said polyimide layer, said structure being produced by:
- applying to said substrate an organic solution, prepared by reacting;
- an aminoalkoxysilane monomer, an arylalkoxysilane or arylsilazane monomer, a tetraalkoxysilane monomer and water in a solvent, wherein said aminoalkoxysilane monomer is an aminotrialkoxysilane selected from the group consisting of $\gamma$-aminopropyltrimethoxysilane, $\gamma$-aminopropyltriethoxysilane, N-$\beta$-(aminoethyl)-$\gamma$-aminopropyltrimethoxysilane and N-$\beta$-(aminoethyl)-$\gamma$-aminopropyltriethoxysilane;
- said arylalkoxysilane monomer is phenyltriethoxysilane;
- said tetraalkoxysilane monomer is tetraethoxysilane and is employed in a proportion of about 20 to about 45 percent based on the moles of total monomer; and
- said reaction is carried out by employing a mole ratio of arylalkoxysilane monomer to aminoalkoxysilane monomer in the range from about 2:3 to about 2.5:1, and a mole ratio of water/total monomer in the range from about 0.9:1 to about 1.7:1;
- heating said substrate at a temperature in excess of about 350° C. for a period from about 15 to about 60 minutes to form said layer of silsesquioxane polymer;
- applying to said layer a solution comprising a polyimide precursor material, wherein said polyimide precursor material comprises biphenylenedianhydride-p-phenylenediamine polyamic acid or pyromellitic dianhydride-oxydianiline polyamic acid, and said metal is copper or an alloy of copper; and
- heating said substrate at a temperature in excess of about 350° C. for a period from about 15 to about 60 minutes to imidize said polyimide precursor material.

5. A process for forming a polyimide layer on a substrate comprising a metal surface, comprising the steps of:

applying to said substrate an organic solution, prepared by reacting an aminoalkoxysilane monomer, an arylalkoxysilane or arylsilazane monomer, a tetraalkoxysilane monomer and water in a solvent;

heating said substrate under such conditions as to form a layer of cured silsesquioxane polymer, containing reactive amino groups which coordinate to said metal, so as to passivate said metal and inhibit interaction between said metal and a polyimide precursor material to be applied;

applying to said cured layer a solution comprising a polyimide precursor material; and heating said substrate under such conditions as to imidize said polyimide precursor material; and wherein:

said aminoalkoxysilane monomer is an aminotrialkoxysilane represented by the formula:

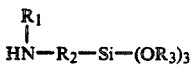

wherein:

$R_1$ is a hydrogen atom; a saturated hydrocarbon residue or an amino-substituted, saturated hydrocarbon residue, having 1 to 5 carbon atoms; or an alkyl-substituted phenyl group or derivatives thereof, the alkyl group having 12 to 5 carbon atoms;

$R_2$ is a saturated hydrocarbon residue having 2 to 6 carbon atoms or an alkyl-substituted phenyl group, each alkyl group having 1 to 5 carbon atoms; and $R_3$ is a saturated hydrocarbon residue having 1 to 8 carbon atoms;

or a mixture thereof;

said arylalkoxysilane or arylsilazane monomer is represented by the formula, $R_4$-Si-$(Y)_3$, wherein $R_4$ is an unsubstituted or substituted aromatic residue and Y is $(OR_6)$ or $N(R_7)_2$, wherein $R_6$ is a saturated hydrocarbon residue having 1 to 5 carbon atoms and $R_7$ is a hydrocarbon atom or a saturated hydrocarbon residue having 1 to 5 carbon atoms; and said tetraalkoxysilane monomer is tetraethoxysilane and is employed in a proportion of about 20 to 45 percent based on the moles of total monomer.

6. A process for forming a polyimide layer on a substrate comprising a metal surface, comprising the steps of:

applying to said substrate an organic solution, prepared by reacting an aminoalkoxysilane monomer and water in a solvent;

heating said substrate under such conditions as to form a layer of cured silsesquioxane polymer containing reactive amino groups which coordinate to said metal, so as to passivate said metal and inhibit interaction between said metal and a polyimide precursor material to be applied;

applying to said cured layer a solution comprising a polyimide precursor material; and heating said substrate under such conditions as to imidize said polyimide precursor material; and wherein:

said polyimide precursor material comprises biphenylenedianhydride-p-phenylenediamine polyamic acid.

7. A process for forming a polyimide layer on a semiconductor substrate containing a pattern of metallization, comprising the steps of:

applying to said substrate an organic solution, prepared by reacting;

an aminoalkoxysilane monomer, an arylalkoxysilane or arylsilazane monomer, a tetraalkoxysilane monomer and water in a solvent, wherein said aminoalkoxysilane monomer is an aminotrialkoxysilane selected from the group consisting of γ-aminopropyltrimethoxysilane, γ-aminopropyltriethoxysilane, N-β-(aminoethyl)-γ-aminopropyltrimethoxysilane and N-β-(aminoethyl)-γ-aminopropyltriethoxysilane;

aid arylalkoxysilane monomer is phenyltriethoxysilane;

said tetraalkoxysilane monomer is tetraethoxysilane and is employed in a proportion of about 20 to about 45 percent based on the moles of total monomer; and said reaction is carried out by employing a mole ratio of arylalkoxysilane monomer to aminoalkoxysilane monomer in the range from about 2:3 to about 2.5:1, and a mole ratio of water/total monomer in the range from about 0.9:1 to about 1.7:1;

heating said substrate at a temperature in excess of about 350° C. for a period from about 15 to about 60 minutes to form a layer of cured silsesquioxane polymer, containing reactive amino groups which coordinate to said metal, so as to passivate said metal and inhibit interaction between said metal and a polyimide precursor material to be applied;

applying to said cured layer a solution comprising a polyimide precursor material, wherein said polyimide precursor material comprises biphenylenedianhydride-p-phenylenediamine polyamic acid or pyromellitic dianhydride-oxydianiline polyamic acid, and said metal is copper or an alloy of copper; and heating said substrate at a temperature in excess of about 350° C. for a period from about 15 to about 60 minutes to imidize said polyimide precursor material.

* * * * *